United States Patent
Schottland et al.

(10) Patent No.: US 10,026,854 B2
(45) Date of Patent: Jul. 17, 2018

(54) ALUMINUM-BASED COMPOSITIONS AND SOLAR CELLS INCLUDING ALUMINUM-BASED COMPOSITIONS

(71) Applicant: Sun Chemical Corporation, Parsippany, NJ (US)

(72) Inventors: Philippe Schottland, Sparta, NJ (US); Jin-an He, Parisppany, NJ (US); Christelle Conan, Lyons (FR); Robert Gilbert, South River, NJ (US); Carl Carter, Lodi, NJ (US); Robert Mateuszczyk, Hopelawn, NJ (US)

(73) Assignee: Sun Chemical Corporation, Parsippany, NJ (US)

( * ) Notice: Subject to any disclaimer, the term of this patent is extended or adjusted under 35 U.S.C. 154(b) by 39 days.

(21) Appl. No.: 15/181,881

(22) Filed: Jun. 14, 2016

(65) Prior Publication Data
US 2017/0054042 A1   Feb. 23, 2017

Related U.S. Application Data

(62) Division of application No. 13/995,040, filed as application No. PCT/US2011/065331 on Dec. 16, 2011, now Pat. No. 9,391,217.

(60) Provisional application No. 61/424,170, filed on Dec. 17, 2010.

(51) Int. Cl.
*H01L 31/0224* (2006.01)
*H01B 1/22* (2006.01)

(52) U.S. Cl.
CPC ....... *H01L 31/022425* (2013.01); *H01B 1/22* (2013.01)

(58) Field of Classification Search
CPC ......... H01L 31/022425; H01L 31/0224; H01L 31/022; H01B 1/22
USPC ........................................... 136/256
See application file for complete search history.

(56) References Cited

U.S. PATENT DOCUMENTS

| | | | |
|---|---|---|---|
| 2007/0215202 A1* | 9/2007 | Salami | C03C 3/062 136/256 |
| 2009/0229665 A1 | 9/2009 | Young et al. | |
| 2009/0255583 A1 | 10/2009 | Young et al. | |
| 2010/0147355 A1* | 6/2010 | Shimizu | H01L 31/02008 136/244 |

FOREIGN PATENT DOCUMENTS

CN   101295739   10/2008

OTHER PUBLICATIONS

Chinese Office Action issued in Chinese Application No. 201180067501.6 dated Jan. 30, 2015.
International Search Report issued in PCT Application No. PCT/US2011/065331, dated Aug. 1, 2012.

* cited by examiner

*Primary Examiner* — Jayne L Mershon
(74) *Attorney, Agent, or Firm* — Charles C. Achkar; Ostrolenk Faber LLP

(57) ABSTRACT

The present invention describes an aluminum-based paste composition including an aluminum powder, one or more glass fits, an organo-aluminate compound; and an organic vehicle. The present invention also describes a solar cell including an aluminum-based paste composition applied on a back surface of a silicon wafer.

20 Claims, 6 Drawing Sheets

|  | Bare wafer | Electrical Results Finished solar cells | | | | Aluminum Printing Parameters | | | |
|---|---|---|---|---|---|---|---|---|---|
|  | Lifetime (μs) | $V_{OC}$(V) | Cell Efficiency (%) | Rseries (Ohm/cm$^2$) | Rshunt (Ohm/cm2) | Print pressure (kg) | Print gap (mm) | Wet Al ink per wafer (g) | Dry Al ink per wafer (g) |
| Comp Ex 1 | 16.84 | 0.613 | 16.4 | 0.841 | 3240 | 8 | 1.8 | 1.163 | 0.957 |
|  | 16.39 | 0.612 | 16.65 | 0.846 | 7320 | 8 | 1.8 | 1.18 | 0.965 |
|  | 16.43 | 0.612 | 15.74 | 1.100 | 1500 | 8 | 1.8 | 1.172 | 0.964 |
|  | 16.35 | 0.613 | 16.29 | 0.711 | 4810 | 8 | 1.8 | 1.164 | 0.959 |
|  | 16.34 | 0.611 | 15.67 | 0.955 | 8390 | 8 | 1.8 | 1.185 | 0.97 |
|  |  | Avg. = 0.612 | Avg. = 16.15 |  |  |  |  |  |  |
| Ex 1 | 17.28 | 0.615 | 16.43 | 0.985 | 1560 | 8 | 1.8 | 1.163 | 0.92 |
|  | 17.37 | 0.613 | 16.49 | 0.849 | 2470 |  | 1.8 | 1.146 | 0.904 |
|  | 17.16 | 0.612 | 16.34 | 0.870 | 4080 | 8 | 1.8 | 1.133 | 0.861 |
|  | 17.99 | 0.614 | 16.67 | 0.835 | 3570 | 8 | 1.8 | 1.142 | 0.896 |
|  | 17.63 | 0.614 | 16.44 | 0.830 | 3690 | 8 | 1.8 | 1.139 | 0.89 |
|  |  | Avg. = 0.614 | Avg. = 16.47 |  |  |  |  |  |  |
| Ex 2 | 14.93 | 0.615 | 16.4 | 0.889 | 6780 | 8 | 1.8 | 1.188 | 0.956 |
|  | 15.03 | 0.615 | 16.45 | 0.887 | 7810 | 8 | 1.8 | 1.195 | 0.963 |
|  | 15.14 | 0.616 | 16.41 | 0.866 | 7360 | 8 | 1.8 | 1.194 | 0.960 |
|  | 14.78 | 0.615 | 16.44 | 0.842 | 10300 |  | 1.8 | 1.195 | 0.961 |
|  | 14.23 | 0.614 | 16.27 | 0.973 | 9770 |  | 1.8 | 1.191 | 0.956 |
|  | 14.63 | 0.612 | 16.22 | 1.110 | 9350 | 8 | 1.8 | 1.147 | 0.919 |
|  |  | Avg. = 0.615 | Avg. = 16.36 |  |  |  |  |  |  |
| Comp Ex 2 | 16.35 | 0.612 | 16.51 | 0.815 | 2880 | 8 | 1.8 | 1.213 | 0.959 |
|  | 16.31 | 0.614 | 16.64 | 0.860 | 6290 | 8 | 1.8 | 1.206 | 0.955 |
|  | 20.01 | 0.610 | 15.92 | 0.833 | 6570 | 8 | 1.8 | 1.234 | 0.975 |
|  | 16.03 | 0.613 | 16.56 | 0.788 | 9270 | 8 | 1.8 | 1.215 | 0.959 |
|  | 16.14 | 0.614 | 16.57 | 0.798 | 7010 | 8 | 1.8 | 1.21 | 0.956 |
|  | 19.49 | 0.612 | 16.5 | 0.962 | 4410 | 8 | 1.8 | 1.153 | 0.911 |
|  | 17.42 | 0.612 | 16.3 | 0.864 | 4760 | 8 | 1.8 | 1.135 | 0.895 |
|  | 16.12 | 0.611 | 16.61 | 0.815 | 7590 | 8 | 1.8 | 1.153 | 0.911 |
|  | 17.20 | 0.612 | 16.22 | 0.873 | 6170 | 8 | 1.8 | 1.13 | 0.895 |
|  | 15.92 | 0.611 | 15.84 | 0.936 | 3670 | 8 | 1.8 | 1.14 | 0.899 |
|  | 16.14 | 0.612 | 15.94 | 1.030 | 3290 | 8 | 1.8 | 1.174 | 0.929 |
|  |  | Avg. = 0.612 | Avg. = 16.32 |  |  |  |  |  |  |

FIG. 6

ALUMINUM-BASED COMPOSITIONS AND SOLAR CELLS INCLUDING ALUMINUM-BASED COMPOSITIONS

The present application is a divisional application of U.S. patent application Ser. No. 13/995,040 filed on Nov. 20, 2013, now U.S. Pat. No. 9,391,217, which is a § 371 National Phase application based on PCT/US2011/065331, filed on Dec. 16, 2011, which claims priority to and benefit of U.S. Provisional Application No. 61/424,170, filed on Dec. 17, 2010, the subject matter of each of which is incorporated by reference in their entirety.

BACKGROUND OF THE INVENTION

Field of the Invention

The present invention is directed to novel aluminum-based pastes with improved properties and solar cells including novel aluminum-based paste compositions.

Description of the Related Art

Solar cells generally consist of two differently doped silicon layers allowing for a separation of charge carriers at the top and bottom surfaces thereof. A standard crystalline silicon solar cell begins with a p-type wafer which is doped with a thin layer of n-type dopants on the front surface or sunlight receiving side.

A pn junction is created where the n and p type layers meet to separate positive (holes) and negative (electrons) charge carriers. When photons from sunlight or artificial sources enter the solar cell, an electron may be promoted from the valence band to the conduction band resulting in a hole in the valence band and an electron in the conduction band. As holes flow to the back surface while electrons flow to the front surface, a current is produced when placed in a circuit.

During production of silicon solar cells, a coating of an aluminum metallization paste is deposited on a back side of the p-type wafer to form a back-surface electrode. Aluminum metallization pastes typically include an aluminum powder, a glass frit and an organic vehicle. While many printing methods may be used to print aluminum metallization pastes, screen printing is considered the most popular method by those skilled in the art. Once the paste is applied on the back surface of the cell, the semiconductor substrate undergoes a drying and firing process. During firing, the cell is heated to temperatures above the melting point of aluminum. An aluminum-silicon alloy layer (Al—Si) is thus formed between an aluminum back side electrode and the p-type silicon semiconductor wafer. Firing also causes a p$^+$ layer (i.e., impurity layer) to form by diffusion of aluminum atoms into the p-type wafer. The Al—Si layer and p$^+$ layer secures ohmic contact between the p-type wafer and the back-side electrode. The Al—Si layer also prevents recombination of electrons since excited electrons in the conduction band of the semiconductor are prevented from falling back into empty states in the valence band. By so doing, a back surface field (BSF) effect improves energy conversion efficiency of the solar cell by increasing the collection efficiency of generated carriers.

Pastes containing heavy metals generally are used to increase solar cell efficiency and open circuit voltage. Heavy metals are natural elements with low densities, such as mercury, cadmium, lead, beryllium and arsenic. Heavy metals are considered toxic or poisonous to humans and animals when concentrated. Thus, most heavy metal elements are regulated by environment regulations at least in Europe and North America. Cadmium, for example, may pose significant health risks including kidney damage/failure and increased likelihood of bone defects and fractures. Lead also poses many health risks including but not limited to negative effects on the gastrointestinal tract, joints, kidneys and the reproductive system. Acute nerve damage may also occur.

Based on the Restrictions of Hazardous Substances Directive (RoHS), heavy metals are generally restricted to 0.1% or 1000 ppm by weight of the homogenous material understood as being a single mechanically separable substance. Cadmium is further restricted to 0.01% or 100 ppm in most applications, however, cadmium presently is not restricted in solar cell applications as of the most recent 2011 RoHS. Values below the RoHS maximums generally are considered heavy metal-free. A need therefore exists to produce pastes and solar cells which are essentially free of lead and other heavy metals while still maintaining high open circuit voltages.

Solar cells also have different sizes based on their intended use. Thus, different amounts of aluminum paste are required to cover solar cells of varying sizes. A problem of maintaining fairly constant and reliable open circuit voltages ($V_{oc}$) at different applied aluminum pastes weights is apparent in the art. A need exists for an aluminum paste composition capable of minimizing or eliminating fluctuations in open circuit voltage when different aluminum paste amounts are applied on a solar cell.

Reducing cost and increasing throughput of solar cells has always been a goal for manufacturers in the solar cell industry. Manufacturers have attempted to reduce costs by making thinner semiconductor substrates. However, when aluminum paste compositions are applied on the backside of thinner wafers, and later fired to a firing temperature, deformation occurs. Specifically, the difference in thermal expansion coefficients between silicon and aluminum results in a concave-shaped cell understood by those in the art as "bowing". Excessive bowing causes a reduction in structural rigidity and in some cases, breakage of the solar cell. On the other hand, too little aluminum paste applied on the back surface of the cell may cause blisters and/or bubbles on the surface after firing. A need therefore exists for an improved aluminum paste composition and solar cell that minimizes bowing to increase product yield. A need also exists for a solar cell with minimal defects such as blisters and/or bumps to improve the aesthetic appeal to customers in the field.

In recent years, there has been a sharp increase in demand for using solar cells as a primary or secondary source of electricity for residential and/or commercial use. Specifically, solar cells have been mounted on roofs or other key areas of homes to absorb maximum amounts of natural light. Constant contact with harsh environmental considerations such as rain, snow, heat and humidity may likely degrade the life expectancy of solar cells. Therefore, a need exists for a solar cell capable of withstanding harsh and/or variable weather conditions and still provide good open circuit voltage ($V_{oc}$).

SUMMARY OF THE INVENTION

An objective of the present invention is to provide an aluminum-based paste that is essentially lead-free and used primarily in solar cell devices to increase open circuit voltage ($V_{oc}$).

Another objective of the present invention is to produce a solar cell with increased cell efficiency.

Another objective of the present invention is to produce a solar cell with reduced cost.

A further objective of the present invention is to reduce the amount of bowing and appearance defects of a solar cell.

A further yet objective of the present invention is to manufacture a solar cell device with a back surface metallization paste composition with good $V_{oc}$ over a wide range of applied aluminum film weights.

In an exemplary embodiment of the present invention, there is described a metallization paste composition comprising an aluminum powder, one or more glass frits, an organo-aluminate compound, and an organic vehicle.

In another exemplary embodiment of the present invention, there is described a solar cell including a wafer and a metallization paste applied on a back surface of the wafer. The metallization paste composition comprises an aluminum powder, one or more glass frits, an organo-aluminate compound and an organic vehicle.

In yet another exemplary embodiment of the present invention, there is described a solar cell comprising a metallization paste applied to a back surface of a wafer wherein the solar cell exhibits a fairly constant open circuit voltage with minimal variance over a range of applied aluminum film weights.

Additional features and advantages of the present invention will be set forth in the description which follows, and in part will be apparent from the description, or may be learned by practice of the invention. The advantages of the invention will be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the Drawings:

FIG. 6 is a tabulation of the electrical properties and printing parameters of Examples 1 and 2, and Comparative Examples 1 and 2.

Figure 1:
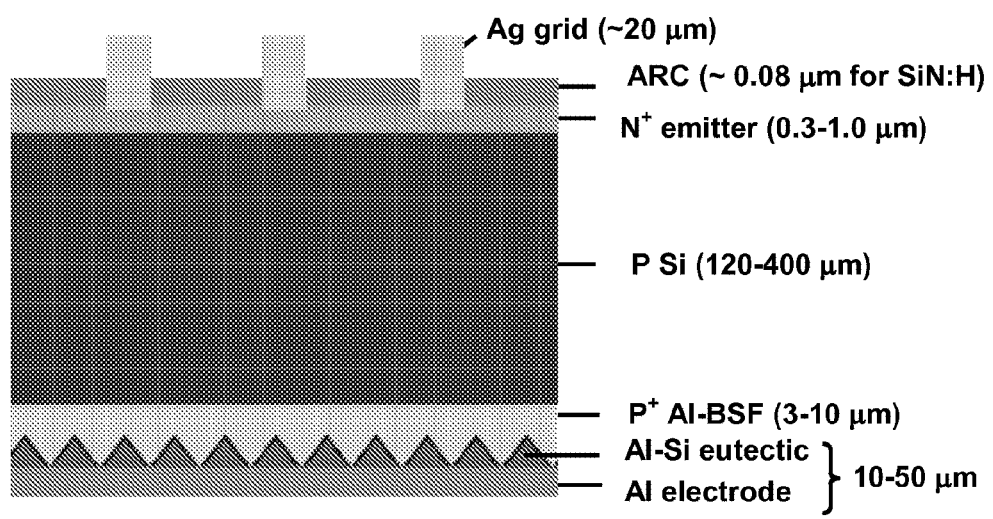
FIG. 1 is an illustration of a solar cell with a paste composition on its back surface layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

DETAILED DESCRIPTION OF THE INVENTION

The present invention describes a novel composition of an aluminum metallization paste. The paste composition at least includes an aluminum powder, one or more glass fits, an organo-aluminate compound, and an organic vehicle. Also described in the present invention is a solar cell comprising a wafer and a layer of the novel aluminum metallization paste on a back surface of the wafer. As will be described in further detail below, the novel metallization paste composition applied to a back surface of a solar cell improves open circuit voltage and bowing characteristics. Additionally, a solar cell having the novel aluminum metallization paste on a back surface exhibits a broader processing window and good water resistance.

The fineness of grind (FOG) of the aluminum metallization paste of the present invention generally is less than 50 p.m. In a preferred embodiment, the FOG is less than 30 μm. In a more preferred embodiment, the FOG is less than 25 μm. The particle size and prevalence of coarse particles of the novel paste were measured using a 5057 gauge from Precision Gauge & Tool Co.

Generally, the particle size distribution (PSD) of the aluminum metallization paste is dependent upon the particle sizes of the frits and aluminum powder. In an exemplary embodiment, the PSD $D_{10}$ of the aluminum metallization paste ranges from about 2.5±0.5 μm. In another exemplary embodiment, the PSD D50 of the aluminum metallization paste ranges from about 6.5 μm±1.0 μm. In yet another exemplary embodiment, the PSD $D_{90}$ of the aluminum metallization paste ranges from about 12 μm±2 μm. Each of the above mentioned PSD results was obtained using a dynamic or static laser light scattering technique as commonly understood by those skilled in the art.

The total aluminum paste composition of the present invention preferably includes a particulate aluminum powder in an amount greater than or equal to 60 wt %. In a more preferred embodiment, the aluminum may be present in an amount greater than or equal to 70% of the total aluminum paste composition. Alternatively, the aluminum may be present in an amount less than or equal to 80% of the total aluminum paste composition. It is generally understood that the "total aluminum paste composition" is the aluminum paste composition supplied to the end-user.

Aluminum powder in an amount less than 60 wt % of the composition causes a reduction is solar cell efficiency because the resistance of the aluminum electro layer formed by firing is increase. Amounts of aluminum greater than 80 wt % may degrade the printing process, especially if screen printing is used.

The aluminum powder has a mean particle size ranging from about 1 to about 30 μm. In one embodiment, aluminum powders having a mean particle size of 2 to 10 μm are preferred. Aluminum powders with a mean particle size less than 1 μm exhibits an undesirably large specific surface area. Meanwhile, aluminum powders with a mean particle size exceeding 20 μm cannot obtain a preferred viscosity of the aluminum paste composition.

The aluminum powder in the paste may be formed of any shape. In one embodiment, the powder is spherically shaped. In another embodiment, the powder is in the shape of a flake. In an alternative embodiment, the powder is irregularly shaped. In yet a further embodiment, the aluminum powder is a combination of spheres, flakes and irregularly-shaped powers.

The aluminum powders of the present invention may also be wetted with one or more organic compounds. These compounds may include, but are not limited to, fatty acids, stearic acid, oleic acid, and solvents such as terpineol, texanol, butyl carbitol.

In an exemplary embodiment, the aluminum powder is non-alloyed. Alternatively, the aluminum powder is non-coated, irregularly-shaped nodular) aluminum powder less than 1% trace elements. In yet another exemplary embodiment, the aluminum powder is atomized. In yet even a further exemplary embodiment, the aluminum powder is made from aluminum grit granulate. Alternatively, the aluminum powder is made from aluminum foil granulate.

In another exemplary embodiment, the aluminum powder may be accompanied by other particulate metals such as silver or silver alloys. These other particular metals are present in amounts less than 5% of the total aluminum paste composition.

The aluminum paste composition of the present invention may also contain one or more glass frits. The glass frits reinforce bonding of the aluminum electrode layer and the p-type silicon semiconductor substrate. The glass frits generally are powders.

In an exemplary embodiment, the glass fit content may be present in a preferred range of 0 to 10 wt. % based on the total aluminum paste composition. In a further exemplary embodiment, the glass fit content ranges from about 1 to 5 wt. % based on the total aluminum paste composition. In even a further exemplary embodiment, the glass fit content ranges from about 0.5 to 3 wt. % based on the total aluminum paste composition. In yet a further embodiment, the one or more glass frits is about 2 wt % of the total aluminum composition.

According to the inventors, if the aluminum-based paste composition were to exceed 8% wt % of glass frit, segregation of glass may occur. It is also likely that a resistance of the aluminum electrode layer may increase, and in turn cause a reduction in power generation efficiency of the solar cell. If the paste composition were to include less than 0.1% of glass frit, the lower limit of the content of the glass frit is greater than or equal to 0.1 wt % there may an insufficient reaction between aluminum and silicon resulting in an insufficient BSF effect.

An average particle size of the glass frit range from about 1 to 10 μm. In a preferred embodiment, the glass frits have a particle size $D_{50}$ of about 3±1 μm. The particle size $D_{90}$ preferably is less than or equal to about 15 μm.

In yet a further exemplary embodiment, the coefficient of thermal expansion of the glass frit compositions preferably range from about $5\text{-}12\times10^{-6}$/K. The softening point of the glass fit compositions preferably range from about 400-600° C. The glass transition temperature, $T_g$, of the glass frit compositions preferably range from about 300-600° C.

Glass frits preferably include, but are not limited to, PbO, $SiO_2$, SrO, $Bi_2O_3$, $B_2O_3$, $Al_2O_3$, ZnO, $La_2O_3$, $ZrO_2$, $TiO_2$, BaO, $Tl_2O$ and mixtures thereof. Examples of commercially useful frits include Viox V2088, Viox V2083 and Viox V1467. In a further exemplary embodiment, the aluminum paste compositions of the present invention are lead-free in accordance with the RoHS guidelines requiring less than 1,000 ppm of lead in an aqueous component.

In one embodiment, the glass frits can be prepared by conventional glassmaking techniques. That is, desired components in desired proportions can be mixed and heated to a peak temperature to form a melt. Heating continues at the peak temperature until the melt is entirely liquid and homogeneous.

In another embodiment, the glass fits may be ball milled with to reduce the particle size of the frit to a substantially uniform size. Alternatively, the glass first may be ball milled with an inert, low viscosity, low boiling point organic liquid to reduce the particle size of the frit to obtain a substantially uniform size. In yet a further embodiment, the frit may subsequently be settled in water and/or an organic liquid to separate fines.

The aluminum-based paste composition of the present invention also includes one or more aluminates. Preferably, the aluminate is an organo-aluminate. The aluminate generally is a solution. It is understood to those skilled in the art that the organo-aluminate is separate and distinct from the one or more glass frits mentioned above.

In one embodiment, the aluminate ranges from about 0 to 2 wt. % based on the total aluminum paste composition. In a more preferred embodiment, the aluminate is from about 0.5 to 2 wt % of the total aluminum paste composition. In yet a further embodiment, the aluminate is from about 0.75 to 2 wt % of the aluminum paste composition. In yet even a further embodiment, the aluminate is from about 1 to 2 wt % of the aluminum paste composition.

In an exemplary embodiment, the aluminate is any aluminate soluble in the solvents of the paste composition. In a further embodiment, the aluminate is a liquid material. Preferred examples include, but are not limited to aluminum butoxide, aluminum butoxide ethylacetoacetate, aluminum diisopropoxide ethylacetoacetate, aluminum ethoxyethoxy ethoxide or any derivatives thereof. In an exemplary embodiment, the aluminate is diisopropyl(oleyl)acetoacetyl which is commercially available as Kenrich® aluminate (KA 322).

The aluminum-based paste composition of the present invention also includes an organic vehicle. In one embodiment, inert viscous materials can be used as the organic vehicle. In another embodiment, the organic vehicle may be one in which the paste composition constituents mentioned above are dispersible with good stability. For example, the organic vehicle may exhibit rheological properties which improves the application properties of the aluminum paste composition. Such improvements may include stable dispersion of insoluble solids, appropriate viscosity and thixotropy for application, appropriate wettability of the silicon wafer substrate and the paste solids, a good drying rate, and good firing properties. In yet even a further embodiment, the organic vehicle may include volatile organic solvents for promoting rapid hardening after application of the aluminum paste on the back-side of the silicon wafer.

The organic vehicle may comprise an organic solvent or an organic solvent mixture. In an exemplary embodiment, the organic vehicle may be a solution of organic polymer(s) in organic solvent(s). The organic vehicle preferably is present in an amount ranging from about 5 to 15 wt. % based on the total aluminum paste composition. In yet a further embodiment, the amount of organic vehicle is present in an amount ranging from about 5 to 14 wt %. In yet a further embodiment, the amount of organic vehicle is present in an amount ranging from about 5 to 13 wt %. In yet a further embodiment, the amount of organic vehicle is present in an amount ranging from about 5 to 12 wt %. In yet even a further embodiment, the amount of organic vehicle is present in an amount ranging from about 5 to 11 wt %. In yet another further embodiment, the amount of organic vehicle is present in an amount ranging from about 5 to 10 wt %. In yet a further embodiment, the amount of organic vehicle is present in an amount ranging from about 5 to 9 wt %. In yet a further embodiment, the amount of organic vehicle is present in an amount ranging from about 5 to 8 wt %. In yet a further embodiment, the amount of organic vehicle is present in an amount ranging from about 5 to 7 wt %. In yet a further embodiment, the amount of organic vehicle is present in an amount ranging from about 7 to 15 wt %. In yet a further embodiment, the amount of organic vehicle is present in an amount ranging from about 7 to 14 wt %. In yet a further embodiment, the amount of organic vehicle is present in an amount ranging from about 7 to 13 wt %. In yet a further embodiment, the amount of organic vehicle is present in an amount ranging from about 7 to 12 wt %. In yet a further embodiment, the amount of organic vehicle is present in an amount ranging from about 7 to 11 wt %. In yet a further embodiment, the amount of organic vehicle is present in an amount ranging from about 7 to 10 wt %. In yet a further embodiment, the amount of organic vehicle is present in an amount ranging from about 7 to 9 wt %. In yet a further embodiment, the amount of organic vehicle is present in an amount ranging from about 9 to 15 wt %. In yet a further embodiment, the amount of organic vehicle is present in an amount ranging from about 9 to 14 wt %. In yet even a further embodiment, the amount of organic vehicle is present in an amount of 9 to 13 wt %. In yet a further embodiment, the amount of organic vehicle is present in an amount ranging from about 9 to 12 wt %. In yet a further embodiment, the amount of organic vehicle is present in an amount ranging from about 9 to 11 wt %. In yet a further embodiment, the amount of organic vehicle is present in an amount ranging from about 11 to 15 wt %. In yet a further embodiment, the amount of organic vehicle is present in an amount ranging from about 11 to 14 wt %. In yet a further embodiment, the amount of organic vehicle is present in an amount ranging from about 11 to 13 wt %. In yet a further embodiment, the amount of organic vehicle is present in an amount ranging from about 12 to 15 wt %. In yet a further embodiment, the amount of organic vehicle is present in an amount ranging from about 12 to 14 wt %. In yet a further embodiment, the amount of organic vehicle is present in an amount ranging from about 13 to 15 wt %.

The organic vehicle may include organic polymers that are free of halogen and chloride. The polymers may also be selected from those that are faster and cleaner burning. In yet a further exemplary embodiment, the polymer may be ethyl cellulose (EC). The polymer may also be an acrylic resin. The polymer may also be an epoxy resin. The polymer may also be a phenol resin. The polymer may also be an alkyd resin. The polymer may also be polyvinyl alcohol. The polymer may also be a rosin. The polymer may be a urethane. The polymer may also be polyester. In yet a further embodiment, the polymer may also be a combination of the above-mentioned polymers.

The organic polymers of the organic vehicle ranges from about 0 to 10%. In an exemplary embodiment, the organic polymer ranges from about 0 to 9 wt % of the organic vehicle. In a further exemplary embodiment, the organic polymer ranges from about 0 to 8 wt % of the organic vehicle. In a further, exemplary embodiment, the organic polymer ranges from about 0 to 7 wt % of the organic vehicle. In a further, exemplary embodiment, the organic polymer ranges from about 0 to 6 wt % of the organic vehicle. In even a further exemplary embodiment, the organic polymer ranges from 0 to 5 wt % of the organic vehicle. In even a further exemplary embodiment, the organic polymer ranges from 0 to 4 wt % of the organic vehicle. In even a further exemplary embodiment, the organic polymer ranges from 0 to 3 wt % of the organic vehicle.

In another, further exemplary embodiment, the organic polymer ranges from 0.5 to 7 wt % of the organic vehicle. In even a further exemplary embodiment, the organic polymer ranges from 0.5 to 6 wt % of the organic vehicle. In even a further exemplary embodiment, the organic polymer ranges from 0.5 to 5 wt % of the organic vehicle. In even a further exemplary embodiment, the organic polymer ranges from 0.5 to 4 wt % of the organic vehicle. In even a further exemplary embodiment, the organic polymer ranges from 0.5 to 3 wt % of the organic vehicle.

In a further, exemplary embodiment, the organic polymer ranges from about 0.75 to 7 wt % of the organic vehicle. In even a further exemplary embodiment, the organic polymer ranges from 0.75 to 6 wt % of the organic vehicle. In even a further exemplary embodiment, the organic polymer ranges from 0.75 to 5 wt % of the organic vehicle. In even a further exemplary embodiment, the organic polymer ranges from 0.75 to 4 wt % of the organic vehicle. In even a further exemplary embodiment, the organic polymer ranges from 0.75 to 3 wt % of the organic vehicle.

In even a further exemplary embodiment, the organic polymer ranges from 1 to 7 wt % of the organic vehicle. In even a further exemplary embodiment, the organic polymer ranges from 1 to 6 wt % of the organic vehicle. In even a further exemplary embodiment, the organic polymer ranges from 1 to 5 wt % of the organic vehicle. In even a further exemplary embodiment, the organic polymer ranges from 1 to 4 wt % of the organic vehicle. In even a further exemplary embodiment, the organic polymer ranges from 1 to 7 wt % of the organic vehicle.

The organic vehicle of the aluminum paste composition of the present invention also includes organic solvents. In a preferred embodiment, the organic solvents have the required solvency power for the particular resin. In an exemplary embodiment, the organic solvents have low vapor pressure and high boiling points. In yet a further exemplary embodiment, organic solvents have the required solvency power for the particular resin and also have low vapor pressure and high boiling points for more stable performance during extended print runs.

In yet even a further exemplary embodiment, the organic solvent may be one or more ester alcohols. In another exemplary embodiment, the organic solvent may include one or more alcohols such as ethanol, propanol, and/or isopropyl alcohol. In a further exemplary embodiment, the organic solvent may include terpene. In even a further exemplary embodiment, the organic solvent may include one or more glycol ethers. In yet another, exemplary embodiment, the organic solvent alternatively include toluene, xylene, butyl carbitol (BC) and/or terpineol. In even a further exemplary embodiment, the organic solvent may be a combination of the above-mentioned solvents which exhibit properties of low vapor pressure and high boiling points.

The organic solvent may range from about 90 to 100 wt. %. of the organic vehicle. In an exemplary embodiment, the organic solvent ranges from about 91 to 100 wt % of the organic vehicle. In a further exemplary embodiment, the organic solvent ranges from about 92 to 100 wt % of the organic vehicle. In a further exemplary embodiment, the organic solvent ranges from about 93 to 100 wt % of the organic vehicle. In a further exemplary embodiment, the organic solvent ranges from about 94 to 100 wt % of the organic vehicle. In a further exemplary embodiment, the organic solvent ranges from about 95 to 100 wt % of the organic vehicle. In a further exemplary embodiment, the organic solvent ranges from about 96 to 100 wt % of the organic vehicle. In a further exemplary embodiment, the organic solvent ranges from about 97 to 100 wt % of the organic vehicle. In a further exemplary embodiment, the organic solvent ranges from about 98 to 100 wt % of the organic vehicle. In a further exemplary embodiment, the organic solvent ranges from about 99 to 100 wt % of the organic vehicle.

In an even further, exemplary embodiment, the organic solvent ranges from about 95 to 99.5 wt % of the organic vehicle. In an even further, exemplary embodiment, the organic solvent ranges from about 96 to 99.5 wt % of the organic vehicle. In an even further, exemplary embodiment, the organic solvent ranges from about 97 to 99.5 wt % of the organic vehicle. In an even further, exemplary embodiment, the organic solvent ranges from about 98 to 99.5 wt % of the organic vehicle. In an even further, exemplary embodiment, the organic solvent ranges from about 99 to 99.5 wt % of the organic vehicle.

In yet even a further, exemplary embodiment, the organic solvent ranges from about 95 to 99 wt % of the organic vehicle. In an even further, exemplary embodiment, the organic solvent ranges from about 96 to 99 wt % of the organic vehicle. In an even further, exemplary embodiment, the organic solvent ranges from about 97 to 99 wt % of the organic vehicle. In an even further, exemplary embodiment, the organic solvent ranges from about 98 to 99 wt % of the organic vehicle.

The aluminum-based pastes of the present invention optionally comprise one or more wetting and dispersing additives. The aluminum-based paste may also include antioxidants. The aluminum paste may also include corrosion inhibitors. The aluminum-based paste may also include antifoaming agents. The aluminum-based paste may also include viscosity improvers. The aluminum-based paste may also include tackifiers. The aluminum-based paste may also include coupling agents. The aluminum-based paste may also include static electricity applying agents. The aluminum-based paste may also include polymerization inhibitors. The aluminum-based paste may also include thixotropy agents. The aluminum-based paste may also include anti-settling agents.

In an exemplary embodiment, the additive(s) may be present in the aluminum paste in a range of 0 to 3 wt. % based on the total aluminum-based paste composition. In another exemplary embodiment, the additive content is 0 to 2 wt. % based on the total aluminum-based paste composition. In another exemplary embodiment, the additive content is 0 to 1 wt. % based on the total aluminum-based paste composition. In yet another exemplary embodiment, the additive content is 0.1 to 3 wt. % based on the total aluminum-based paste composition. In yet another exemplary embodiment, the additive content is 0.1 to 2 wt. % based on the total aluminum-based paste composition. In yet another exemplary embodiment, the additive content is 0.1 to 1 wt. % based on the total aluminum-based paste composition. In a further exemplary embodiment, the additive content is greater than or equal to 0.2% wt % of the aluminum-based paste composition.

The semiconductor wafer used in the manufacture of the solar cell primarily is made of silicon. In one embodiment, the wafer is monocrystalline. In an alternative embodiment, the wafer is polycrystalline. In another embodiment, the wafer has a thickness of less than 400 µm. In a further embodiment, the wafer has a thickness less than or equal to 300 µm. In yet another embodiment, the wafer has a thickness ranging from about 100 to 300 µm. In yet even another embodiment, the silicon wafer has a thickness ranging from about 140 to 200 µm. In yet even another embodiment, the silicon wafer has a thickness ranging from about 140 to 180 µm.

In an exemplary embodiment, the silicon wafer has a surface area of about 100 to 400 cm$^2$. In another embodiment, an area of the silicon wafer is 250 to 400 cm$^2$. In yet another embodiment, an area of the silicon wafer is 100 to 250 cm$^2$.

The silicon wafer has a diameter less than or equal to 18 inches. In another embodiment, the silicon wafer may have a diameter less than or equal to 12 inches. In a further, embodiment, the silicon wafer may have a diameter less than or equal to 8 inches. In yet a further embodiment m the silicon wafer may have a diameter less than or equal to 6 inches. In yet even a further embodiment, the silicon wafer preferably may have a diameter less than or equal to 5 inches. In another embodiment, the silicon wafer may have a diameter less than or equal to 4 inches. In a further exemplary, the silicon wafer may have a diameter less than or equal to 3 inches. In a further embodiment, silicon wafer may have a diameter less than or equal to 2 inches. The yet a further exemplary embodiment, silicon wafer may have a diameter less than or equal to 1 inch.

In another embodiment, the silicon substrate may be textured. Texturing increases surface roughness. Etching solutions may be used to form surface roughnesses called disruptions on the substrate surface for enhancing light trapping thus improving conversion efficiency.

Preparation of Pastes

In an exemplary embodiment, an aluminum back surface metallization paste is prepared according to the following steps. First, the organic vehicle (solvent and binder) is prepared. Glass frits are optionally milled in the organic vehicle solvent of the paste composition at a solids content between 20 and 70 wt %. A three-roll mill process or a bead milling process may be applied in order to obtain a NPIRI grind gauge reading below 20 microns. Aluminates are next added to the organic vehicle and mixed using a dual asymmetric centrifuge. Aluminum is subsequently added to the mixed components and undergoes mixing again in the centrifuge. After the paste cools to room temperature, the paste is dispersed using a dissolver. The viscosity may optionally be adjusted with solvent or organic vehicle to a target print viscosity ranging between about 15 and 50 Pa·s at a shear rate of 10 s$^{-1}$ measured at 25° C. on an AR-2000 T A Instruments cone and plate rheometer.

Preparation of Solar Cells

FIG. 1 is an illustration of a preferred solar cell according to the present invention. The solar cell of the present invention is prepared via the following steps. First, a monocrystalline Si wafer is provided. The silicon wafer is p-doped to a conductivity of 2 Ohm-cm. The emitter sheet resistance is 35-85 Ohm/sq as measured by a Jandel 4 point probe. The cells are textured and the front surface is coated with a standard silicon nitride (SiNx) anti-reflective coating. The lifetimes, otherwise known as the minority carrier lifetime, of the wafers is about 14 to 20 µs when using a DEK Galaxy 810 printer. The minority carrier lifetime is measured using a Sinton Instruments (Boulder, Colo. —USA) WCT-120 Lifetime tester performed via the generalized lifetime analysis method as disclosed in the Sinton WCT-120 operating manual. The Minority Carrier Density (MCD) is specified at 2E+15 for lifetime calculations.

In an exemplary embodiment, silver paste is screen printed onto the front side of the crystalline Si wafer. A printing pressure of about 3 to about 6 kg is used. The print gap is set at about 1.4 mm. The screen used in the printing process of the silver paste had a mesh count of 280 per inch, a wire diameter of 25 µm, and an emulsion of 25 µm.

Aluminum-based paste compositions of the present invention preferably are screen printed onto crystalline silicon wafers at a printing pressure of about 6 to about 12 kg. In an exemplary embodiment, the print pressure is about 6 to about 8 kg. The print gap between the crystalline Si wafer and screen of the printing device may vary from about 1.4 to about 2.2 mm. The print gap may range from about 1.6 to about 1.8 mm. The screens of the printing device had a mesh count of about 200 to 280 per inch, a wire diameter of about 40 µm, and an emulsion of about 10 µm. The aluminum-based pastes applied via screen printing to crystalline Si wafers typically have a thickness of 200-300 µm. The application viscosity of the aluminum pastes of the present invention may be 10-100 Pa·s, preferably 15-60 Pa·s, as measured at a shear rate of 10 s$^{-1}$ and 25° C. using an AR 2000 from TA Instruments.

While screen printing is most preferred, other printing methods are permitted by adjusting the viscosity and rheological properties of the aluminum-based metallization paste. Examples of other printing methods include contact and non contact printing or coating methods such as silicone pad printing, spray coating, roller coating, flexo, gravure, litho, aerosol jet deposition, micro-contact printing, inkjet, etc.

The printed metallization paste is dried in a 3-zone BTU D-914 dryer with the zone settings of 150° C., 170° C., and 190° C. and a belt speed of 20 inches/min. Alternatively, a rotary or stationary IR drier may be used. Drying time may range anywhere from 30 seconds to 10 minutes. The silicon wafer may obtain a drying temperature ranging from about 100 to 300° C.

The printed wafers are co-fired in a BTU PV309 4-zone oven with settings of 700-640-640-890° C. and a belt speed of 85 inches/min to produce finished solar cells. Firing may be performed, for example, for a period of 1 to 5 minutes with the silicon wafers reaching a peak temperature in the range of about 700 to 900° C. Firing may be performed as a so-called co-firing together with further metal pastes that have been applied to the silicon wafer, (i.e., front-side and/or back-side metal pastes which have been applied to form front-side and/or back-side electrodes on the wafer's surfaces during the firing process). An exemplary embodiment includes front-side silver pastes and backside silver or back-side silver/aluminum pastes The aluminum-based paste has a dry film thickness ranging from about 10 to 60 µm. In another embodiment, the dry film thickness ranges from about 15 to 50 µm. In yet a further embodiment, the dry film thickness ranges from about 20 to 40 µm. In yet even a further embodiment, the dry film thickness ranges from about 25 to 35 µm.

As shown in FIG. 1, an Al—Si eutectic layer is formed upon an aluminum electrode with a combined thickness about 10 to 50 µm. In addition, the p$^+$ Al back surface field is formed upon the Al—Si eutectic layer with a thickness of about 3-10 µm.

A busbar may also be added to the back surface which is not covered by the back-side metal paste. Examples included but are not limited to backside silver and silver aluminum pastes.

Solar Cell Efficiency

The efficiency of the solar cells of the present invention was measured using a Solar Simulator/I-V tester from PV Measurements Inc. The illumination of the lamp was calibrated using a sealed calibration cell, and the measured characteristics were adjusted to standard AM1.5G illumination conditions (1000 mW/cm$^2$). During testing, the cells were positioned on a vacuum chuck located under the lamp and the chuck temperature was maintained at 24° C.+/−1 using a chiller. Both dark and light I-V curves were collected by sweeping voltage between −0.2V and +1.2V and measuring current. Standard solar cell electrical parameters were collected from the instrument including Cell efficiency (%), Series resistance $_{(Rseries)}$, Shunt Resistance ($R_{shunt}$) and Open Circuit Voltage ($V_{oc}$). The Cell efficiency, 11, is equal to the fill factor and is a key parameter in evaluating the performance of a solar cell. The fill factor is defined as the ratio of the maximum power from the solar cell to the product of $V_{oc}$ and $I_{sc}$. Graphically, the fill factor is a measure of the "squareness" of the solar cell and also is the area of the largest rectangle which will fit in the I-V curve. The results in this invention were obtained using standard computer software available in the industry for measuring electrical parameters of solar cells.

Ink Coverage

Figure 5A:
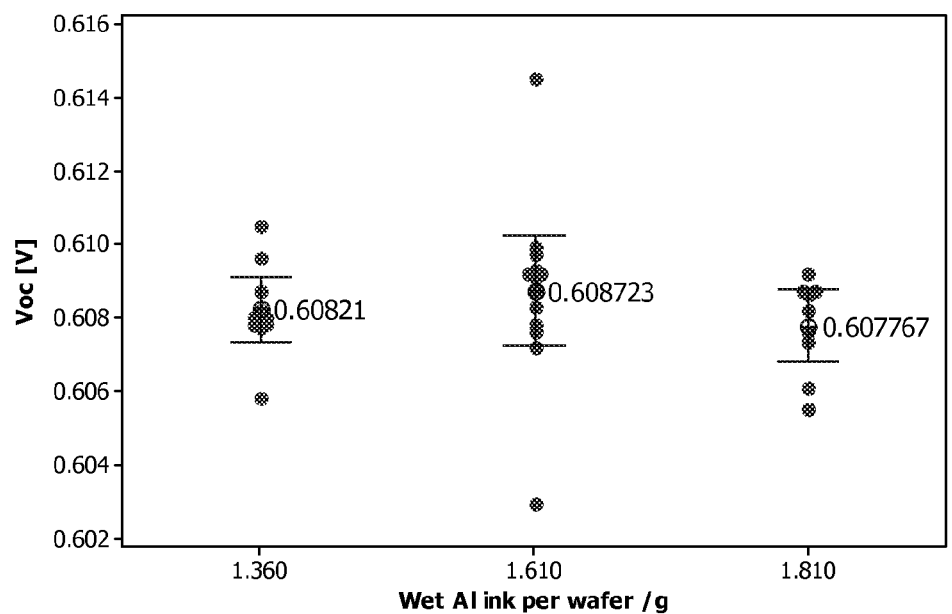
FIG. 5A is a graph of $V_{oc}$ performance of different inventive wet aluminum paste weights on a wafer.

FIG. 5A illustrates $V_{oc}$, performance of different inventive wet aluminum paste weights on a wafer. The test was performed prior to firing. Specifically, print lay downs ranging from about 1.3 to about 1.9 grams of aluminum metallization paste were deposited onto a back surface of a crystalline Si wafer being 5 or 6 inches in diameter, about 100 to about 200 µm in thickness and about 10 grams. Specifically, three experimental runs were conducted at wet aluminum paste weights of about 1.360 grams, 1.610 grams, and 1.810 grams. It is understood that more aluminum paste equates to a thicker back surface field, and in turn, better $V_{oc}$. Surprisingly, the novel aluminum pastes of the present invention maintained fairly consistent electrical performance at each of the aluminum paste weights. Namely, for wet aluminum print lay downs of 1.360, 1.610 and 1.810, the $V_{oc}$, was 0.60821 V, 0.608723 V and 0.607767 V, respectively. The results indicate that optimal electrical performance can be achieved using less aluminum-based metallization paste. Hence, material costs can significantly be reduced when scaled up for commercial use.

Bowing

Figure 4:
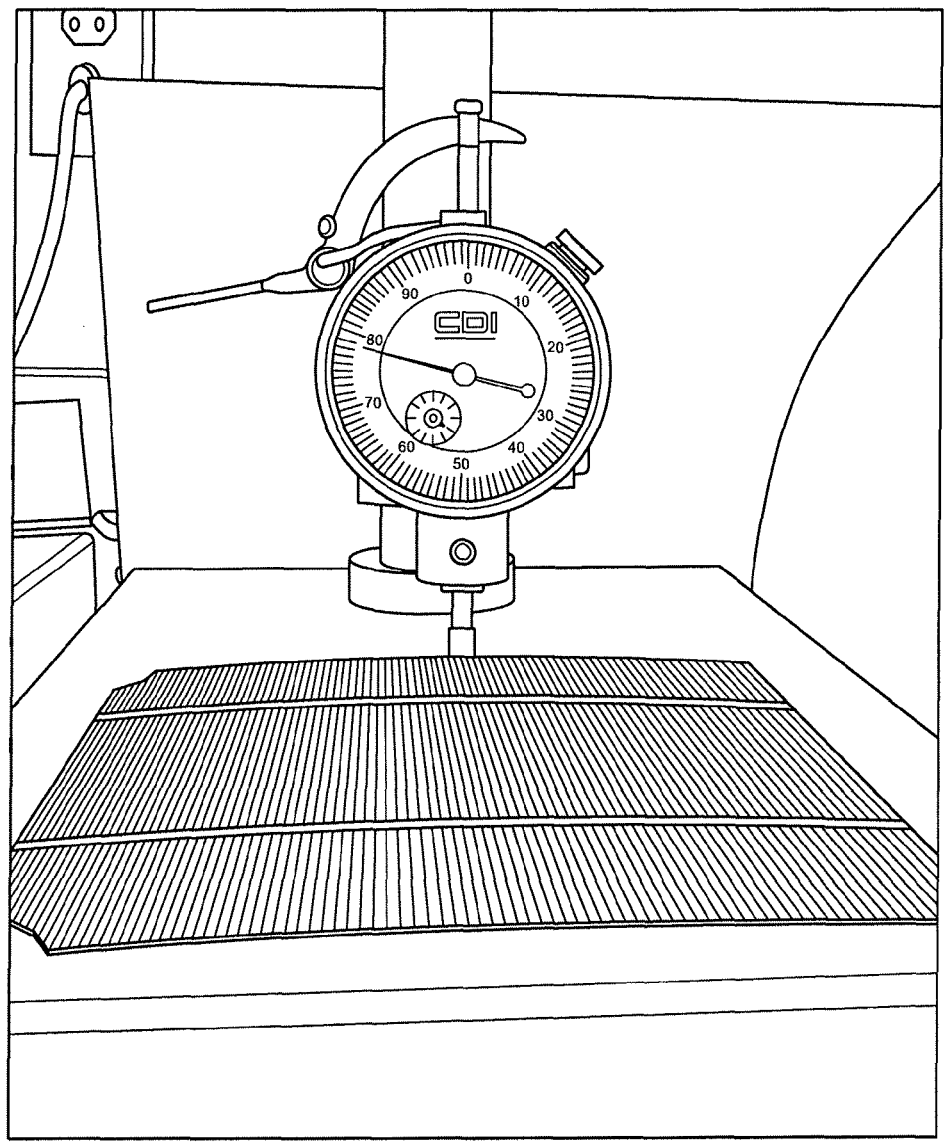
FIG. 4 is a depiction of an instrument for testing bowing of the solar cell.

Bowing was tested by placing the fired solar cell on a flat and leveled surface, such as granite, with the wafer's center aligned with a probe of a mechanic dial gauge to measure the peak of the convex wafer as shown in FIG. 4.

There is a significant difference between the thermal expansion coefficients of aluminum and silicon that will lead to wafer bowing where the bending stress has been overcome. Bowing can cause problems with handling and wafer mounting during module production. Generally, the aluminum pastes of the present invention may cause a crystalline Si wafer to bow 0-3.0 mm. In an exemplary embodiment, the crystalline silicon wafer bows less than about 1.5 mm, and more preferably less than 1.0 mm, when measured immediately after the firing of the wafer.

The bowing value is considered to depend upon factors including: wafer size, wafer thickness, wafer type (i.e., monocrystalline or polycrystalline), firing temperature, time of measuring bowing after firing, amount of applied wet lay down aluminum paste, amount of front side silver paste and back side tabbing paste.

Figure 5B:
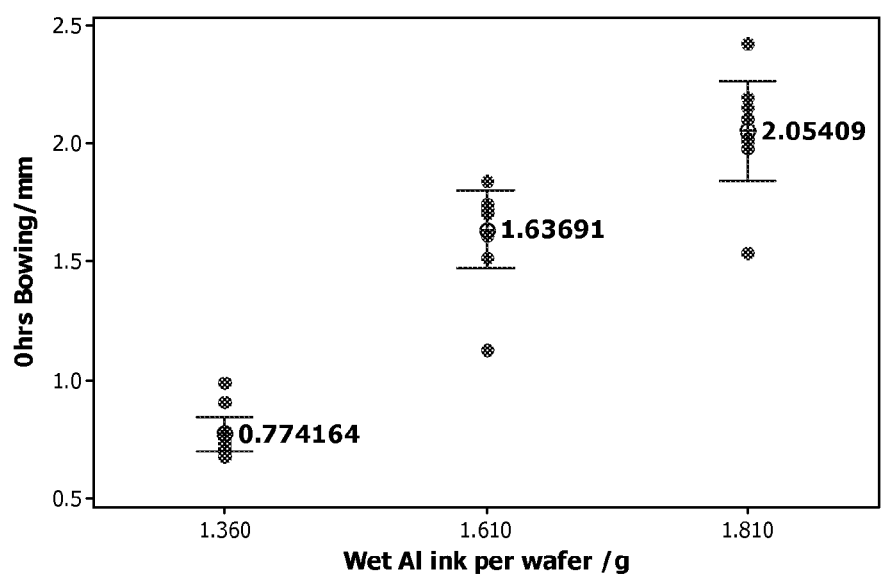
FIG. 5B is a graph illustrating bowing for each of the samples assessed in FIG. 5A.

FIG. 5B illustrates bowing in mm for each of the samples assessed in FIG. 5A. As known in the art, thermal stress relaxes with time. Accordingly, bowing measurements for each of the samples was performed directly after firing of the solar cell. According to FIG. 5B, an aluminum-based paste weight of 1.360 grams exhibited the least amount of bowing of about 0.774 mm among the three tested samples. The inventors conclude that the sample with the least amount of aluminum-based paste weight improved structural rigidity of the solar cell while also maintaining comparable voltage characteristics to other tested samples having almost 0.5 grams more aluminum-based paste weight.

Adhesion

Cross-hatch adhesion of the applied aluminum on a crystalline Si wafer was also tested. The test method is adapted from ISO 2409: 1992. A cutting tool having six parallel blades with a 1.0 mm space between each blade and a cross-hatch at 90° angles is cut into an area of the wafer. The cuts made into the wafer about 25 mm long. The cross-hatched area is softly brushed with a soft brush to remove particles. A strip of 12.5 mm wide by 50 mm long pressure sensitive tape is firmly adhered across the surface of the crosshatched area as described in section 14 of BS 1133.

Rapidly remove the tape by manual force applied perpendicular to the pattern. Visually examine the cross-hatched area for detachment of flakes. The appearance of the cross-hatched area is classified on a 0-5 scale, with 0 (no ink removal) being the best, and 5 (complete ink removal) being the worst. It is preferable that the aluminum paste has a classification of 0-2.

Water Stability

A piece of the crystalline Si wafer (approximately 5 mm×5 mm) with the applied aluminum paste is placed in a phosphate buffer for 30 minutes. The buffer is 20 mM $Na_2HPO_4$—$NaH_2PO_4$ with a pH of 5.8 and is controlled at a temperature of 75° C. As generally recognized in the industry, if the aluminum paste causes violent bubbling upon contacting the Si wafer, the paste does not pass the water stability test.

Appearance

The aesthetic appearance of the solar device is assessed after it has completed the firing process. Defects are defined as "bubbles" or "blisters" that appear on the aluminum layer. These "bubbles" or "blisters" are typically smoothly rounded hills that are irregularly spread over the surface. The solar devices are assessed by determining the % defect coverage of the entire device. It is preferred that the device is co-fired at temperatures ranging from 750 to 850° C. The aluminum paste compositions in the present invention exhibit approximately 0% defects at the above-mentioned temperatures.

Pencil Hardness

Scratch hardness is used to determine the resistance of the applied aluminum to scratch effects on a crystalline Si wafer. This test is performed in accordance to ASTM D3363-05 and ISO 15184 using a Wolf Wilburn Pencil Hardness Tester. It is preferable that the aluminum-based paste has a Pencil Hardness of 6 H or higher.

The present invention has been described in detail, including the preferred embodiments thereof. However, it will be appreciated that those skilled in the art, upon consideration of the present disclosure, may make modifications and/or improvements on this invention that fall within the scope and spirit of the invention.

EXAMPLES

The following examples illustrate specific aspects of the present invention and are not intended to limit the scope thereof in any respect and should not be so construed.

Example 1 is an aluminum paste containing 80% aluminum powder, 2% glass frit, 1% aluminate and an organic vehicle. The composition of Example 1 is presented in Table 1 below:

TABLE 1

| Composition description | Weight % |
|---|---|
| Glass frit #1 | 2.00 |
| Silica | 0.50 |
| Wetted Aluminum powder | 80.00 |
| Organo Aluminate | 1.00 |
| Ethyl cellulose (EC) varnish* | 11.50 |
| Surfactant | 0.20 |
| Solvent | 4.80 |
| — | 100.00 |

*Varnish composition = 5.25% EC N200; 58.32% Texanol; 36.44% Terpineol

Example 1 has a viscosity of 34.19 Pa·s and provides crystalline silicon solar cells with $V_{oc}$ of 614 mV, Efficiency of 16.47%, Pencil hardness of 6 H, Cross hatch adhesion of 1, no appearance defects (i.e. 0%), and Bowing of 0.87 mm (for 700-640-640-890° C./85 ipm firing profile). The electrical results and printing parameters for example 1 is tabulated in FIG. 6.

Example 2 is an aluminum paste at least containing 80% aluminum powder, 2% of two different glass frits, 1% aluminate, and an organic vehicle. The glass frits in example 2 include Viox V2083 in an amount of 1.50 wt % of the composition and Viox V1467 in an amount of 0.50 wt % of the composition.

This example has a viscosity of 47.16 Pa·s and provides crystalline silicon solar cells with $V_{oc}$, of 615 mV, Efficiency of 16.39%, Series resistance Rs of 0.89 ohm·cm², Pencil hardness of 6 H, Cross hatch adhesion of 1, no (0%) appearance defects, and Bowing of 1.26 mm (for 700-640-640-890° C./85 ipm firing profile). The electrical results and printing parameters for example 2 is tabulated in FIG. 6.

In comparative example 1, there is provided a lead-free aluminum formulation, representing a traditional paste composition without an organo-aluminate presented in Table 2 below.

TABLE 2

| Composition Description | Weight % |
|---|---|
| Wetted Aluminum powder | 75.00 |
| Glass frit #2 | 7.32 |
| Fatty acid | 1.00 |
| Acrylic resin | 2.50 |
| Ethylcellulose resin | 0.36 |
| Solvent | 13.82 |
| — | 100.00 |

Comparative example 1 exhibits a viscosity of 15.4 Pa·s and enables crystalline silicon solar cells with a $V_{oc}$, of 612 mV, Efficiency of 16.22%, Pencil hardness of 6 H, Cross hatch adhesion of 1, and Bowing of 2.74 mm (for 700-640-640-890° C./85 ipm firing profile). The electrical results and printing parameters for comparative example 1 is tabulated in FIG. 6.

In comparative example 2, there is described an aluminum paste containing 2% glass frit and 1% organo-titanate as presented in Table 3 below.

TABLE 3

| Description | Weight % |
|---|---|
| Glass frit #3 | 2.00 |
| Silica | 0.50 |
| Wetted Aluminum powder | 80.00 |

TABLE 3-continued

| Description | Weight % |
| --- | --- |
| Organo-Titanate | 1.00 |
| EC varnish (same as in Paste B) | 13.14 |
| Solvent | 3.36 |
| — | 100.00 |

The viscosity of comparative example 2 was 41.2 Pa·s and provides crystalline silicon solar cells with a $V_{oc}$ of 612 mV, Efficiency of 16.32%, Pencil hardness of 6 H, Cross hatch adhesion of 1, 55% appearance defects, and Bowing of 2.3 mm (for 700-640-640-890° C./85 ipm firing profile). The electrical results and printing parameters for comparative example 2 is tabulated in FIG. 6.

Examples 1 and 2 in view of comparative examples 1 and 2 suggests that the addition of an organo-aluminate component to the aluminum paste exhibits improved electrical performance $V_{oc}$ and cell efficiency. In addition, examples 1 and 2 also exhibited significantly less bowing versus comparative examples 1 and 2. Further, examples 1 and 2 were generally defect-free at least in comparison to comparative example 2 which exhibited about 55% appearance defects.

Damp Heat

Damp heat characteristics also were analyzed with respect to Example 1 in view of Comparative Example 1. The paste of Example 1 and the paste of Comparative Example 1 were applied to several different crystalline Si wafers. These wafers were placed in a humidity chamber set at about 85° C.±2° C. and 85%±5% Relative Humidity. The damp heat test used herein is a standard procedure known to those of ordinary skill and is expressly detailed in "*IEC Standard 61646*". The test is used to determine the ability of the solar cell to withstand the effects of long-term penetration of humidity. Periodically, the printed devices were removed from the chamber to measure the change in electrical properties.

Figure 2:
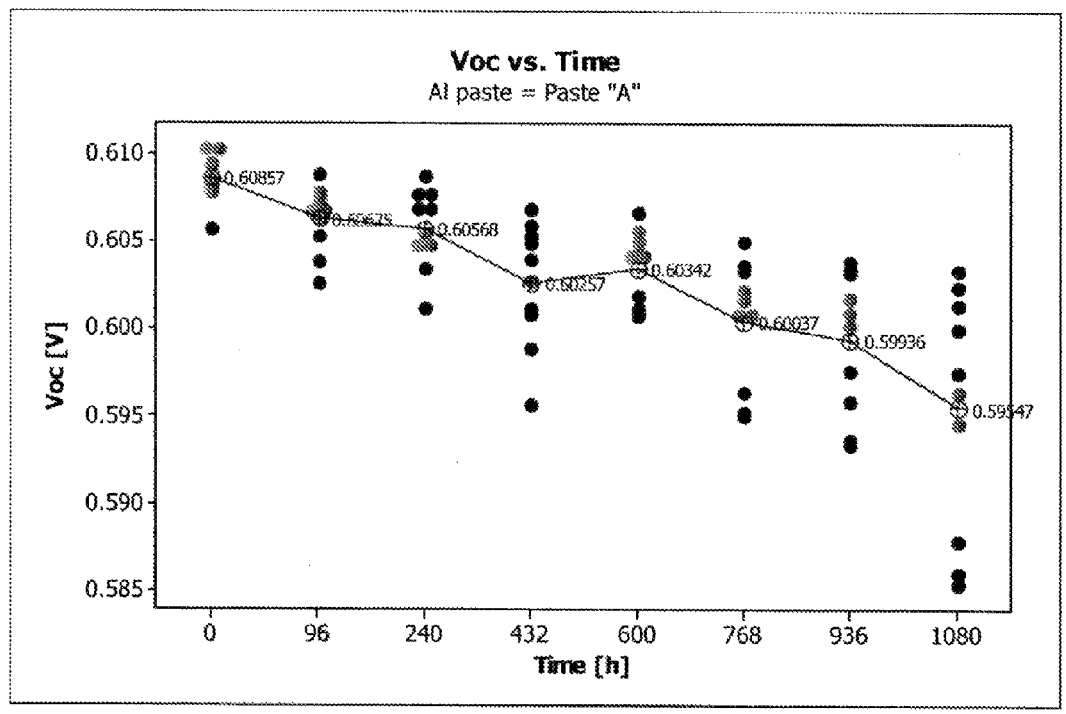
FIG. 2 is a graph displaying the damp heat stability of a conventional aluminum paste.

FIG. 2 illustrates the change in $V_{oc}$ over the course of 1,080 hours for Comparative Example 1. The damp heat stability testing of Comparative Example 1 exhibits degradation in the $V_{oc}$ over time. Namely, the $V_{oc}$ fluctuated between 0.609 V and 0.595 V.

Figure 3:
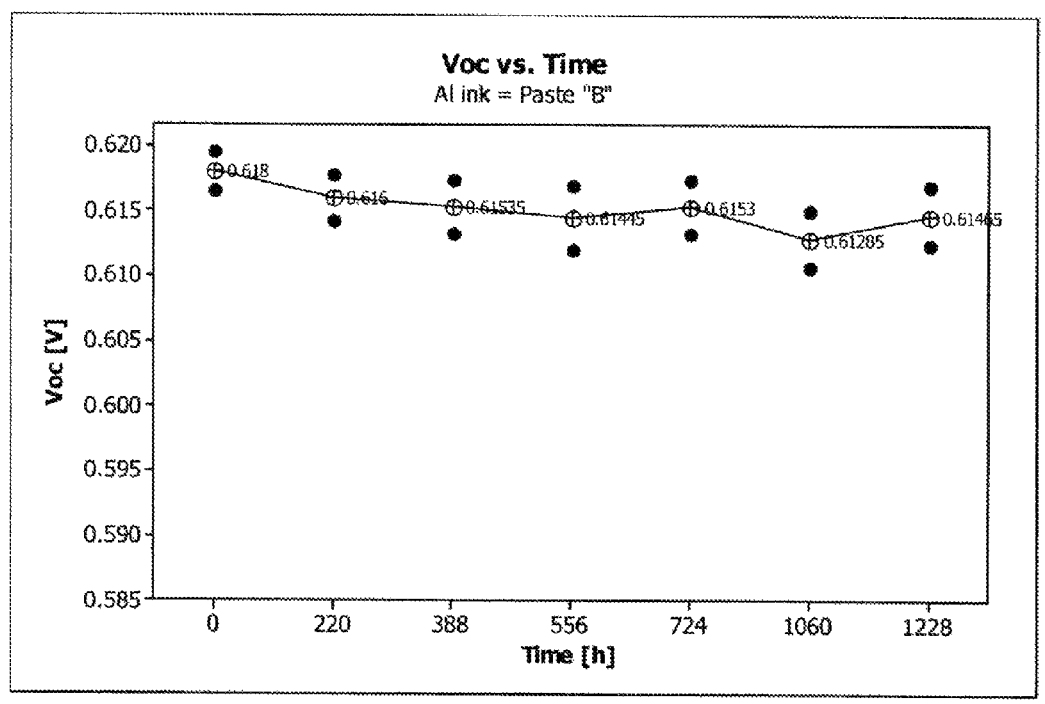
FIG. 3 is a graph displaying the damp heat stability of an aluminum paste of the present invention.

FIG. 3 illustrates the change in $V_{oc}$ over the course of 1,228 hours for Example 1. $V_{oc}$ remains fairly constant between about 0.612 V and 0.620 V. More preferably, the $V_{oc}$ remains fairly constant between about 0.0.61285 V and 0.618 V. The damp heat study demonstrates that the novel aluminum-based paste composition of the present invention has better electrical performance over a long period of time when compared to conventional paste compositions. Typically, the present inventions exhibits variances of about ±0.006 V.

Table 4 illustrates some properties of commercially available aluminum powders that can be used in the development of aluminum pastes for back surface passivation of photovoltaic devices. Preferred aluminum powders for the present invention are those that have higher aluminum oxide layer thicknesses. Aluminum oxide layer thickness can be determined by using Equation 2 by Strohmeier[1].

$$d = \lambda_0 \sin\Theta \, \ln\!\left(\frac{N_m \lambda_m I_o}{N_o \lambda_o I_m} + 1\right)$$

TABLE 4

| Aluminum Powder | Surface Area (m²/g) | Residue @ 100° (%) | Residue @ 500° C. (%) | Oxidation Onset (° C.) | Weight gain (%) | ESCA atomic concentration summary (atomic percent) | | | | Aluminum, reduced | Aluminum, oxide |
| --- | --- | --- | --- | --- | --- | --- | --- | --- | --- | --- | --- |
| | | | | | | [Al] | [Cl] | [O] | [Zn] | | |
| Ecka BAI-10HP | 1.1 | 99.38 | 98.74 | 555 | 28.32 | 32 | 10.9 | 57.1 | ND | 27 | 73 |
| ULT0465 | .2 | 99.45 | 99.35 | 565 | 23.91 | 28.1 | 20 | 51.4 | 0.5 | 14 | 86 |
| ULT0565 | <0.1 | 99.71 | 100.1 | 567 | 18.75 | 31 | 13.1 | 55.5 | 0.4 | 16 | 84 |
| AGS 4-6 | 0.3 | 99.44 | 99.66 | 568 | 15.86 | 14.8 | 56.7 | 28.4 | ND | 13 | 87 |
| 1404 | <0.1 | 99.87 | 100.7 | 584 | 24.9 | 30.2 | 16.8 | 53 | ND | 26 | 74 |

Three of the above aluminum powders in the above table were used in an aluminum paste formulation. The aluminum oxide thickness was determined for each powder. The electron take-off angle was 65°. An $N_m/N_o$ ratio of 1.5 was used. The aluminum oxide layer thickness for the aluminum powders was determined to be as follows: 1404=39.02 Å; Ecka BAI-10HP=43.44 Å; ULT0565=46.01 Å; ULT0465=53.82 Å; AGS4-6=53.92 Å.

Water stability experiments were carried out on fired solar cells prepared with pastes containing an organo-aluminate compound according to the present invention. It was determined that a preferred minimum oxide thickness of about 45 Å provides enhanced water stability after firing.

Example 3 as provided in Table 5 below is a lead-free based formula that contains an organo-aluminate and an aluminum powder of Alcoa 1404.

TABLE 5

| Description | Weight % |
| --- | --- |
| Glass frit #3 | 2.00 |
| Silica | 0.50 |
| Dry aluminum powder (1404 Alcoa) | 74.80 |
| Organo Aluminate | 2.00 |
| EC varnish (same as in Paste B) | 10.00 |
| Fatty acid | 3.00 |
| Surfactant | 0.20 |
| Solvent | 7.50 |
| — | 100.00 |

Example 3 has a viscosity of 34.4 Pa·s. The crystalline silicon solar cell exhibits electrical characteristics including: $V_{oc}$ of 618 mV, Efficiency of 16.44%, Series resistance Rs of 1.4 ohm·cm². The paste exhibits a Pencil hardness of 5 H, Cross hatch adhesion of 2, and Bowing of 1.4 mm (using a 700-640-640-890C/85 ipm firing profile). However, example 3 fails the water stability test as according to the indicators mentioned earlier in the disclosure.

Example 4 as shown in Table 6 below is a lead-free based formula that contains an organo-aluminate and Ecka BAI-10 HP aluminum powder.

TABLE 6

| Description | Weight % |
|---|---|
| Glass frit #3 | 1.96 |
| Silica | 0.49 |
| Dry aluminum powder (Ecka) | 73.33 |
| Organo aluminate | 1.96 |
| EC varnish (same as in Paste B) | 9.80 |
| Fatty acid | 2.94 |
| Surfactant | 0.20 |
| Solvent | 9.31 |
| — | 100.00 |

Example 4 has a viscosity of 55 Pa·s. The crystalline silicon solar cell exhibits electrical characteristics including: V°, of 618 mV, Efficiency of 16.77%, Series resistance Rs of 0.98 ohm·cm². The paste exhibits a Pencil hardness of 6 H, Cross hatch adhesion of 1, and Bowing of 2.0 mm (under a firing profile of 700-640-640-890° C./85 ipm). However, example 4 fails the water stability test according to the procedure described earlier in the specification.

Example 5 as shown in Table 7 below is a lead-free based formula that also contains an aluminate and ULT 05675 aluminum powder.

TABLE 7

| Description | Weight % |
|---|---|
| Glass frit #3 | 2.00 |
| Silica | 0.50 |
| Dry Aluminum powder (ULT 0565) | 74.80 |
| Organo Aluminate | 2.00 |
| EC varnish (same as in Paste B) | 11.00 |
| Fatty acid | 3.00 |
| Surfactant | 0.20 |
| Solvent | 6.50 |
| — | 100.00 |

Example 5 exhibits a viscosity of 51.5 Pa·s. The crystalline silicon solar cells exhibit electrical characteristics including: $V_{oc}$, of 615 mV, Efficiency of 16.46%, Series resistance Rs of 1.1 ohm·cm². The paste also exhibits a Pencil hardness of 5 H, Cross hatch adhesion of 2, and Bowing of 1.8 mm at 890° C. and passes water stability.

Examples 3, 4 and 5 indicate that aluminum powders having a thicker aluminum oxide layer allows the resultant paste to be more likely to pass water stability testing.

The results of these different formulations clearly indicate that the properties of the components used affect the overall performance of the paste and is therefore not trivial to formulate a successful aluminum paste for photovoltaic applications.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A solar cell comprising a silicon wafer and an aluminum-based paste, said aluminum-based paste including:
    a) an aluminum powder;
    b) one or more glass frits;
    c) one or more organo-aluminate compounds; and
    d) an organic vehicle.

2. The solar cell according to claim 1, wherein said silicon wafer is a monocrystalline wafer.

3. The solar cell according to claim 1, wherein said one or more organo-aluminate compounds is less than or equal to 2 wt. % of said aluminum-based paste.

4. The solar cell according to claim 3, wherein said one or more organo-aluminate compounds is greater than or equal to 1 wt. % of said aluminum-based paste.

5. The solar cell according to claim 1, wherein said one or more organo-aluminate compounds is selected from diisopropyl(oleyl)acetoacetyl and any derivatives thereof.

6. The solar cell according to claim 1, wherein said one or more glass frits ranges from 0.5 to 3 wt. % of said aluminum-based paste.

7. The solar cell according to claim 1, wherein said one or more glass frits is less than or equal to 2 wt. % of said aluminum-based paste.

8. The solar cell according to claim 1, wherein said one or more glass frits is one type of material.

9. The solar cell according to claim 1, wherein a D90 particle size distribution of said aluminum-based paste ranges from 10 to 14 μm.

10. The solar cell according to claim 1 exhibiting less than 2.0 mm of bowing directly after firing.

11. The solar cell according to claim 1, wherein a thickness of said aluminum-based paste ranges from 13 to 60 μm.

12. The solar cell according to claim 1 exhibiting superior water stability.

13. The solar cell according to claim 12, wherein said aluminum-based paste includes an aluminum oxide layer thickness greater than or equal to 45 Angstroms.

14. The solar cell of claim 1, wherein the aluminum-based paste is applied to the back surface of the silicon wafer; and wherein the solar cell maintains an open circuit voltage variance of ±0.006 V for at least 1,000 hours when exposed to temperatures of 85° C.±2° C. and a relative humidity of 85%±5%.

15. The solar cell according to claim 14, wherein the open circuit voltage ranges from 0.6125 to 0.6185 V.

16. The solar cell according to claim 15 maintaining the open circuit voltage variance for at least 1,200 hours.

17. The solar cell according to claim 14, wherein a cell efficiency ranges from 16.36 to 16.47%.

18. The solar cell of claim 14 comprising a minimal amount of aluminum-based paste weight applied to the back surface of the silicon wafer without compromising open circuit voltage characteristics of the solar cell.

19. The solar cell according to claim 18 exhibiting an open circuit voltage ranging from 0.607 to 0.609 V with 1.4 g to 1.8 g of said applied aluminum-based paste.

20. The solar cell according to claim 18, where the silicon wafer thickness ranges from 100 to 300 μm.

* * * * *